(12) United States Patent
Chen et al.

(10) Patent No.: US 12,658,866 B2
(45) Date of Patent: Jun. 16, 2026

(54) BULK COMPLEMENTARY METAL-OXIDE SEMICONDUCTOR RADIO FREQUENCY SWITCH WITH ENHANCED RADIO FREQUENCY POWER HANDLING

(71) Applicant: Samsung Electronics Co., Ltd., Gyeonggi-do (KR)

(72) Inventors: Ying Chen, San Jose, CA (US); Che-Chun Kuo, San Jose, CA (US); Tienyu Chang, Sunnyvale, CA (US)

(73) Assignee: Samsung Electronics Co., Ltd (KR)

( * ) Notice: Subject to any disclaimer, the term of this patent is extended or adjusted under 35 U.S.C. 154(b) by 333 days.

(21) Appl. No.: 18/197,175

(22) Filed: May 15, 2023

(65) Prior Publication Data

US 2024/0291446 A1 Aug. 29, 2024

Related U.S. Application Data

(60) Provisional application No. 63/448,476, filed on Feb. 27, 2023.

(51) Int. Cl.
| | |
|---|---|
| *H04B 1/44* | (2006.01) |
| *H03F 1/56* | (2006.01) |
| *H03F 3/24* | (2006.01) |
| *H10W 44/20* | (2026.01) |

(52) U.S. Cl.
CPC ............ *H03F 3/245* (2013.01); *H03F 1/565* (2013.01); *H04B 1/44* (2013.01); *H10W 44/20* (2026.01); *H03F 2200/294* (2013.01); *H10W 44/234* (2026.01)

(58) Field of Classification Search
CPC .... H03F 3/245; H03F 1/565; H03F 2200/294; H01L 23/66; H01L 2223/6655; H04B 1/44; H04B 1/48; H03K 17/693; H03K 17/6871
See application file for complete search history.

(56) References Cited

U.S. PATENT DOCUMENTS

| | | | | |
|---|---|---|---|---|
| 6,313,700 | B1 * | 11/2001 | Nishijima | H03F 3/68 330/129 |
| 10,148,239 | B1 * | 12/2018 | Lin | H03F 3/72 |
| 10,276,521 | B2 | 4/2019 | Babcock et al. | |
| 11,128,327 | B2 | 9/2021 | Abbasi et al. | |
| 2007/0232241 | A1 * | 10/2007 | Carley | H04B 1/44 455/83 |

(Continued)

FOREIGN PATENT DOCUMENTS

| | | |
|---|---|---|
| CN | 113364482 | 9/2021 |
| CN | 215452940 | 1/2022 |

OTHER PUBLICATIONS

H. Xu, et al., "A 31.3-dBm Bulk CMOS T/R Switch Using Stacked Transistors With Sub-Design-Rule Channel Length in Floated p-Wells," IEEE JSSC, vol. 42, No. 11, Nov. 2007, pp. 7.

*Primary Examiner* — Md K Talukder
(74) *Attorney, Agent, or Firm* — The Farrell Law Firm, P.C.

(57) ABSTRACT

A single-pole single-throw (SPST) radio frequency (RF) switch is provided that includes one or more switches stacked in series, and a first capacitor disposed at an input side of the SPST RF switch, in series, before the one or more switches. The SPST RF switch also includes a second capacitor disposed, in parallel, across the one or more switches, and an inductor disposed at an output side of the SPST RF switch, in series, after the one or more switches.

19 Claims, 13 Drawing Sheets

(56) References Cited

U.S. PATENT DOCUMENTS

| | | | |
|---|---|---|---|
| 2012/0293254 A1* | 11/2012 | Liu | G05F 1/46 |
| | | | 323/283 |
| 2016/0301369 A1 | 10/2016 | Heaney et al. | |
| 2019/0158066 A1* | 5/2019 | Ju | H03K 17/04106 |
| 2022/0038098 A1 | 2/2022 | Malladi | |
| 2024/0291446 A1* | 8/2024 | Chen | H03F 3/245 |
| 2025/0079982 A1* | 3/2025 | Chen | H02M 1/082 |

* cited by examiner

702 — Receiving first signal, via SPST switch, and forming series resonance between first capacitor and inductor of the SPST switch 704 — Transmitting second signal and forming voltage switch division by first capacitor and second capacitor of the SPST switch

BULK COMPLEMENTARY METAL-OXIDE SEMICONDUCTOR RADIO FREQUENCY SWITCH WITH ENHANCED RADIO FREQUENCY POWER HANDLING

CROSS-REFERENCE TO RELATED APPLICATION

This application claims the priority benefit under 35 U.S.C. § 119(e) of U.S. Provisional Application No. 63/448, 476, filed on Feb. 27, 2023, the disclosure of which is incorporated by reference in its entirety as if fully set forth herein.

TECHNICAL FIELD

The disclosure generally relates to radio frequency (RF) switches. More particularly, the subject matter disclosed herein relates to improvements to RF power handling in bulk complementary metal-oxide semiconductor (CMOS) RF switches.

SUMMARY

RF switches are widely used in modern RF transceivers (i.e., transmitters (TXs) and receivers (RXs)). FIGS. 1A and 1B are diagrams illustrating an RF front-end (FE) with a time-division duplex (TDD) operation, where the same antenna is shared between the TX and the RX. Sharing the same antenna between the TX and the RX allows the RF system to be more compact and more cost effective.

In FIG. 1A, a single-pole double-throw (SPDT) transmit/receive (T/R) switch 102, at the interface between a transmission FE circuitry 104 and reception FE circuitry 106, is used to switch between a power amplifier (PA) 108 during transmission from an antenna 110 and a low-noise amplifier (LNA) 112 during reception at the antenna 110. A single-pole single-throw (SPST) switch 114 may be inserted in the RX branch, as shown in FIG. 1B. The SPST switch 114 is not provided in the TX branch because the insertion loss caused by the SPST switch may severely degrade TX output power and efficiency.

During reception in FIG. 1B, when the SPST switch 114 is on (or closed), a minimized insertion loss at the switch results in a better noise figure (NF). During transmission in FIG. 1B, when the SPST switch 114 is off (or open), a sufficiently high parallel equivalent off resistance $R_{off}$ at the switch results in minimization of TX output power loss and efficiency degradation, due to the RX branch loading. In a 50 $\Omega$T/R interface, an $R_{off}$ of higher than 1 k$\Omega$ may be needed to minimize degradation to the TX. In the off mode, during a transmission operation, a high RF power handling capability of the SPST switch 114 may withstand the maximum voltage swing due to the high output power from the PA 108.

Compared to RF switches in CMOS silicon-on-insulator (SOI) technology, RF switches in bulk CMOS technology have a key advantage of low cost, which is crucial to enable numerous cost-sensitive applications. However, the power handling capabilities are worse in RF switches implemented in bulk CMOS technology.

FIGS. 2A and 2B are diagrams illustrating an n-channel metal-oxide semiconductor (NMOS) transistor in the bulk CMOS technology. The limited power handling capabilities in the bulk CMOS switch during a switch-off state is due to the low bulk-to-substrate impedance in combination with drain-to-bulk and source-to-bulk p-n junction diodes $D_{db}$ and $D_{sb}$ of a transistor 202, as shown in FIG. 2A. When there are large voltage swings at drain/source nodes, diodes $D_{db}$ and/or $D_{sb}$ may become forward biased during a period of voltage swing to the low side, which would trigger a drain-bulk-source parasitic n-p-n transistor to turn on during a switch-off state.

To solve these problems, a deep n-well transistor 204 may be used in the bulk CMOS process to assist in creating a higher impedance from body to substrate with two back-to-back connected and direct current (DC) reverse-biased diodes $D_{dnw1}$ and $D_{dnw2}$, as shown in FIG. 2B. The higher impedance from body to substrate may also create a voltage swing at a body node that swings in-phase with the voltage at drain/source nodes. Thus, the transistor 204 is able to withstand a higher voltage swing before diodes $D_{db}$ and/or $D_{sb}$ become forward-biased.

However, the diodes $D_{db}$ and/or $D_{sb}$ of the deep n-well transistor may still become forward-biased at large voltage swings, which is caused by two factors. First, when the voltage swing becomes large at the body node, either $D_{dnw1}$ (during positive swing cycle) or $D_{dnw2}$ (during negative swing cycle) can become forward biased. When this happens, the impedance from body to substrate is reduced, which limits the maximum voltage swing at the body. Second, when a larger sized switch transistor is used to optimize insertion loss, the impedance from body to substrate is also reduced due to the larger values of $D_{dnw1}$ and $D_{dnw2}$. The lower impedance from body to substrate can also lower the voltage swing at the body node.

To overcome these issues, systems and methods are described herein for enhancement of the power handling capabilities of the SPST switch, while achieving a high $R_{off}$. Design optimizations are enabled among high power handling capabilities, a high $R_{off}$, and a low insertion loss.

The above approaches improve on previous methods because, if $R_{off}$ exceeds a target specification by a large margin, the topology allows for a trade-off of the high $R_{off}$ to obtain higher power handling capabilities to meet product requirements, while maintaining a low insertion loss.

In an embodiment, an SPST RF switch is provided that includes one or more switches stacked in series, and a first capacitor disposed at an input side of the SPST RF switch, in series, before the one or more switches. The SPST RF switch also includes a second capacitor disposed, in parallel, across the one or more switches, and an inductor disposed at an output side of the SPST RF switch, in series, after the one or more switches.

In an embodiment, an RF transceiver is provided that includes an antenna, transmission FE circuitry in a transmission branch extending from the antenna, and reception FE circuitry in a reception branch extending from the antenna. The RF transceiver also includes an SPST switch disposed between the reception FE circuitry and the antenna in the reception branch. The SPST switch includes one or more switches stacked in series, and a first capacitor disposed at an input side of the SPST RF switch, in series, before the one or more switches. The SPST RF switch also includes a second capacitor disposed, in parallel, across the one or more switches, and an inductor disposed at an output side of the SPST RF switch, in series, after the one or more switches.

In an embodiment, a method for operating an RF transceiver is provided. A first signal is received via an SPST switch and reception FE circuitry of the RF transceiver. A series resonance at a center frequency of operation is formed, between a first capacitor disposed at an input side of the SPST switch and an inductor disposed at an output side of the SPST switch, improving input and output impedance matching of the SPST switch. A second signal is transmitted via transmission FE circuitry of the RF transceiver. A voltage switch division is formed by the first capacitor of the SPST switch and a second capacitor disposed, in parallel, across one or more switches of the SPST switch, reducing a voltage swing a first switch of the one or more switches.

BRIEF DESCRIPTION OF THE DRAWINGS

In the following section, the aspects of the subject matter disclosed herein will be described with reference to exemplary embodiments illustrated in the figures, in which.

DETAILED DESCRIPTION

Figure 1A:
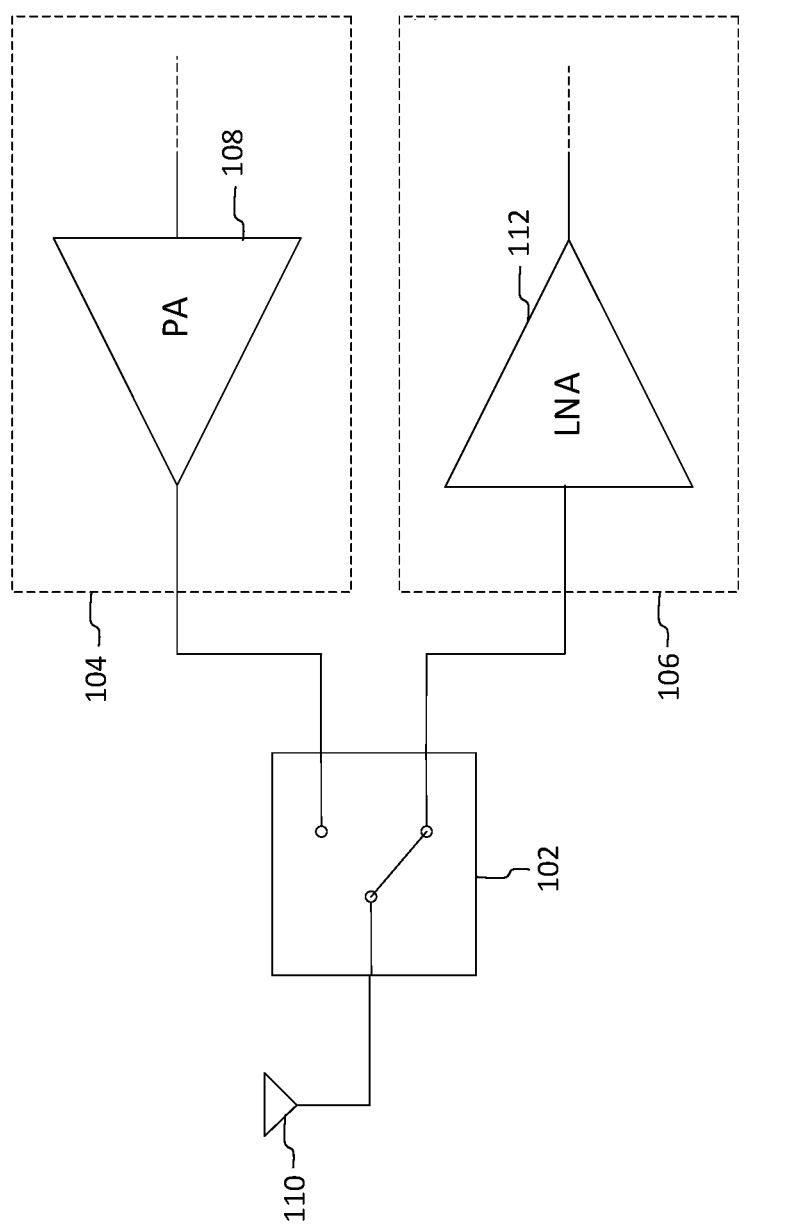
FIGS. 1A and 1B are diagrams illustrating an RF FE with a TDD operation.
Figure 1B:
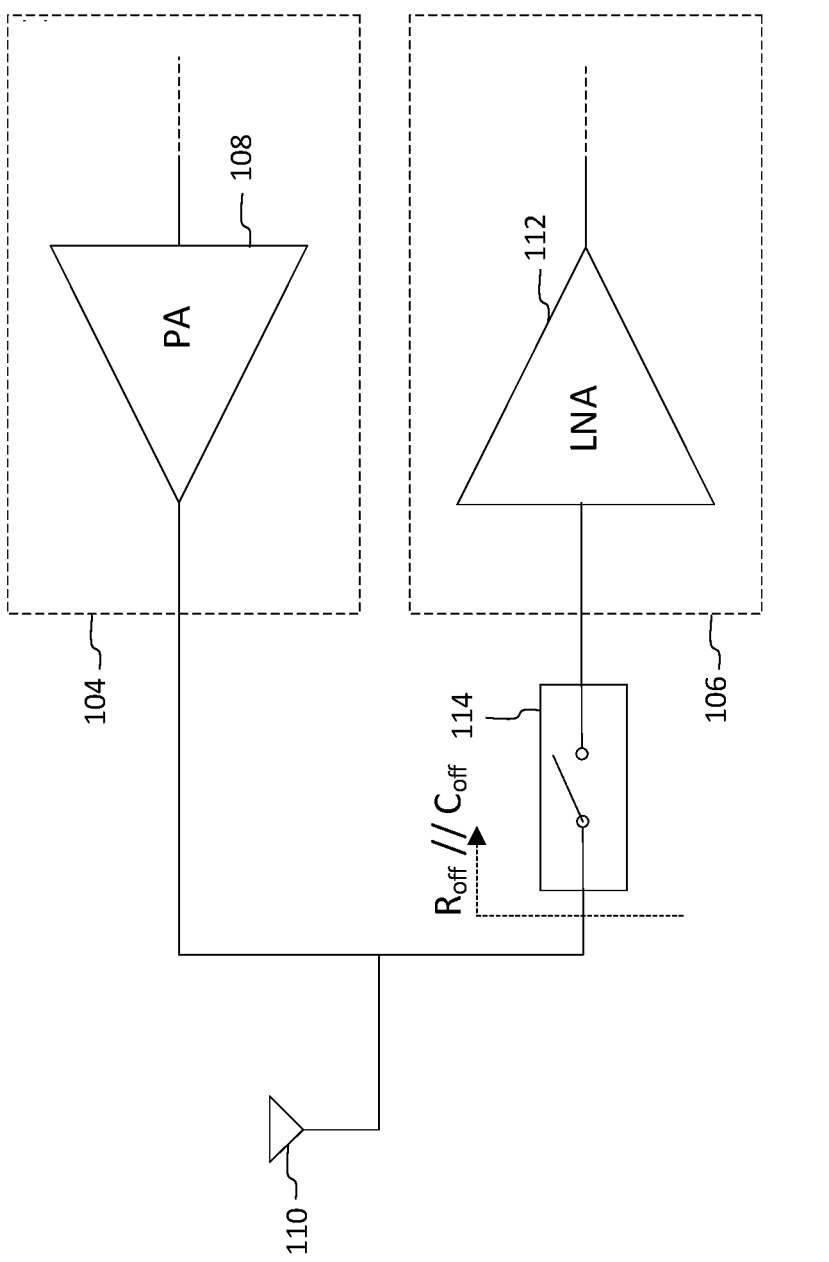
Figure 2B:
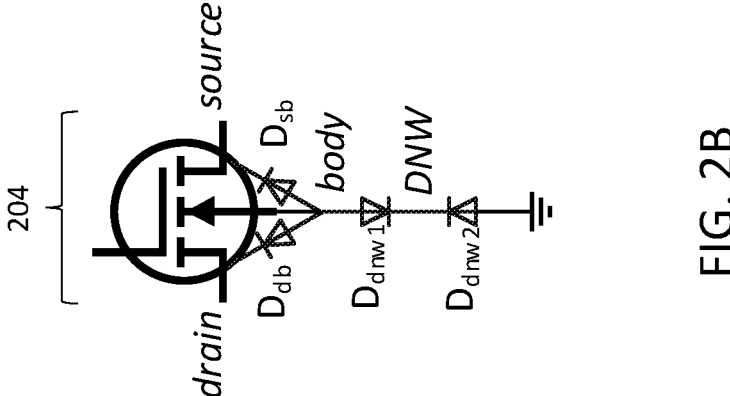
FIGS. 2A and 2B are diagrams illustrating an NMOS transistor in the bulk CMOS technology.
Figure 2A:
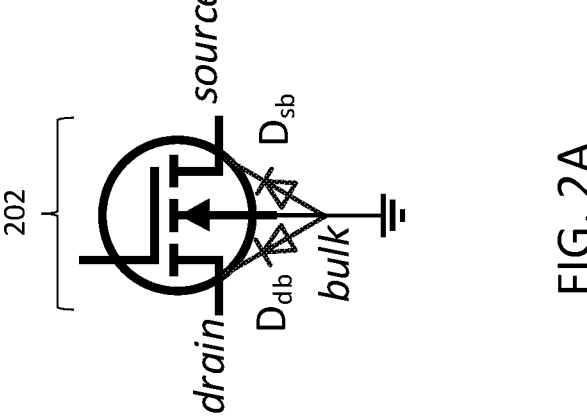

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

Figure 3A:
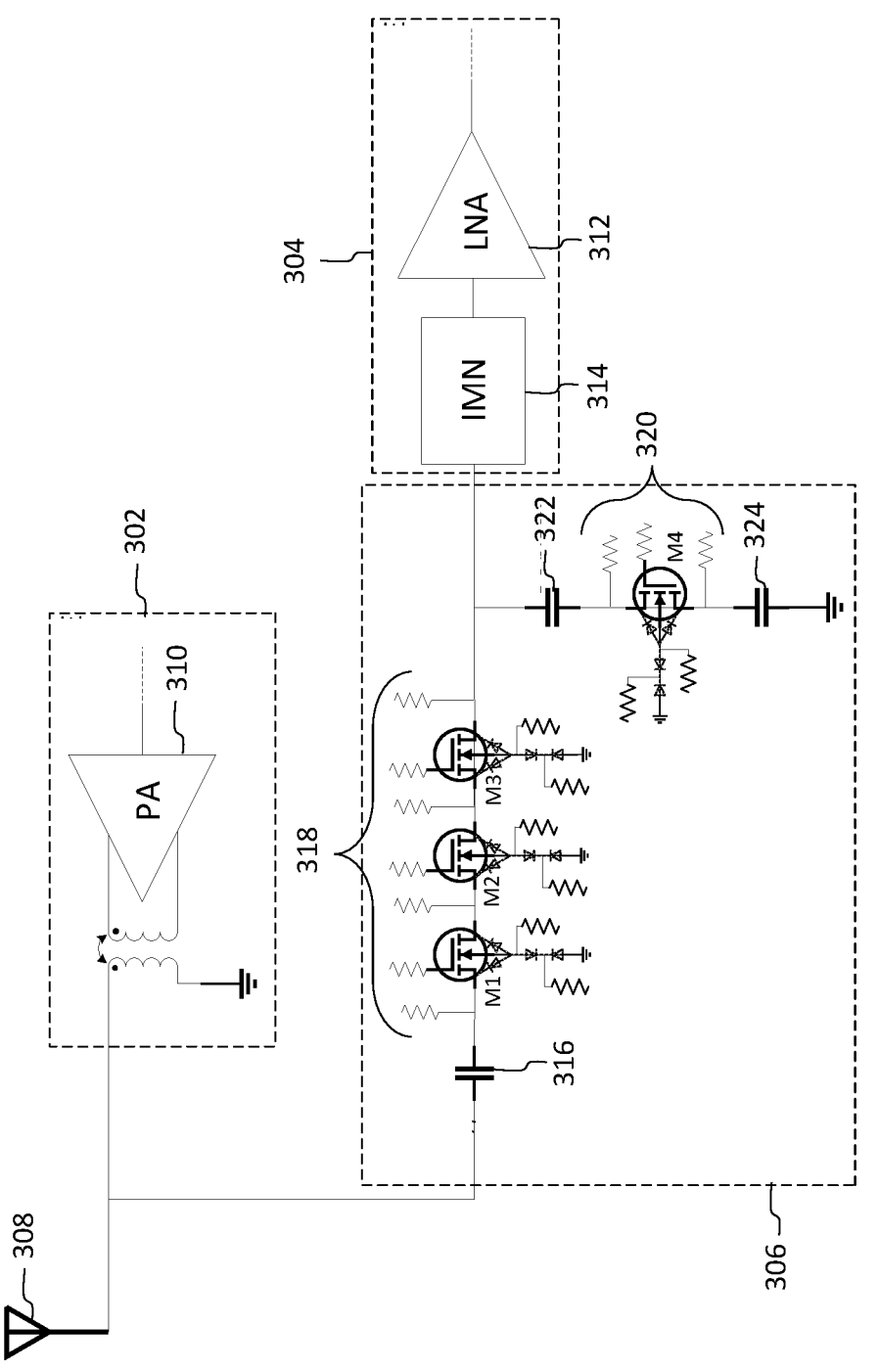
FIG. 3A is a diagram illustrating a T/R interface with an RF series-shunt switch topology in a bulk CMOS process.

FIG. 3A is a diagram illustrating a T/R interface with an RF series-shunt switch topology in a bulk CMOS process. The interface includes transmission FE circuitry 302, reception FE circuitry 304, an SPST switch 306, and an antenna 308. The transmission FE circuitry 302 includes a PA 310, and the reception FE circuitry 304 includes an LNA 312 and input matching network (IMN) 314.

The SPST switch 306 includes a first DC block capacitor 316, three series switches 318, and one shunt switch 320 between second and third DC block capacitors 322 and 324. During reception, the series switches 318 turn on and the shunt switch 320 turns off. The off shunt switch 320 handles the RF power. During transmission, the series switches 318 turn off and the shunt switch 320 turns on. The parallel equivalent off resistance of this topology is usually very high, however, it has a significant drawback with respect to RF power handling capabilities. The off series switches 318 handle the high RF power. Since the RF power in the reception mode is much lower than in the transmission mode, the number of stacked switches for the shunt switch 320 is usually less than the number for the series switches 318, and the power handling capabilities are limited by the off series switches 318.

Figure 3B:
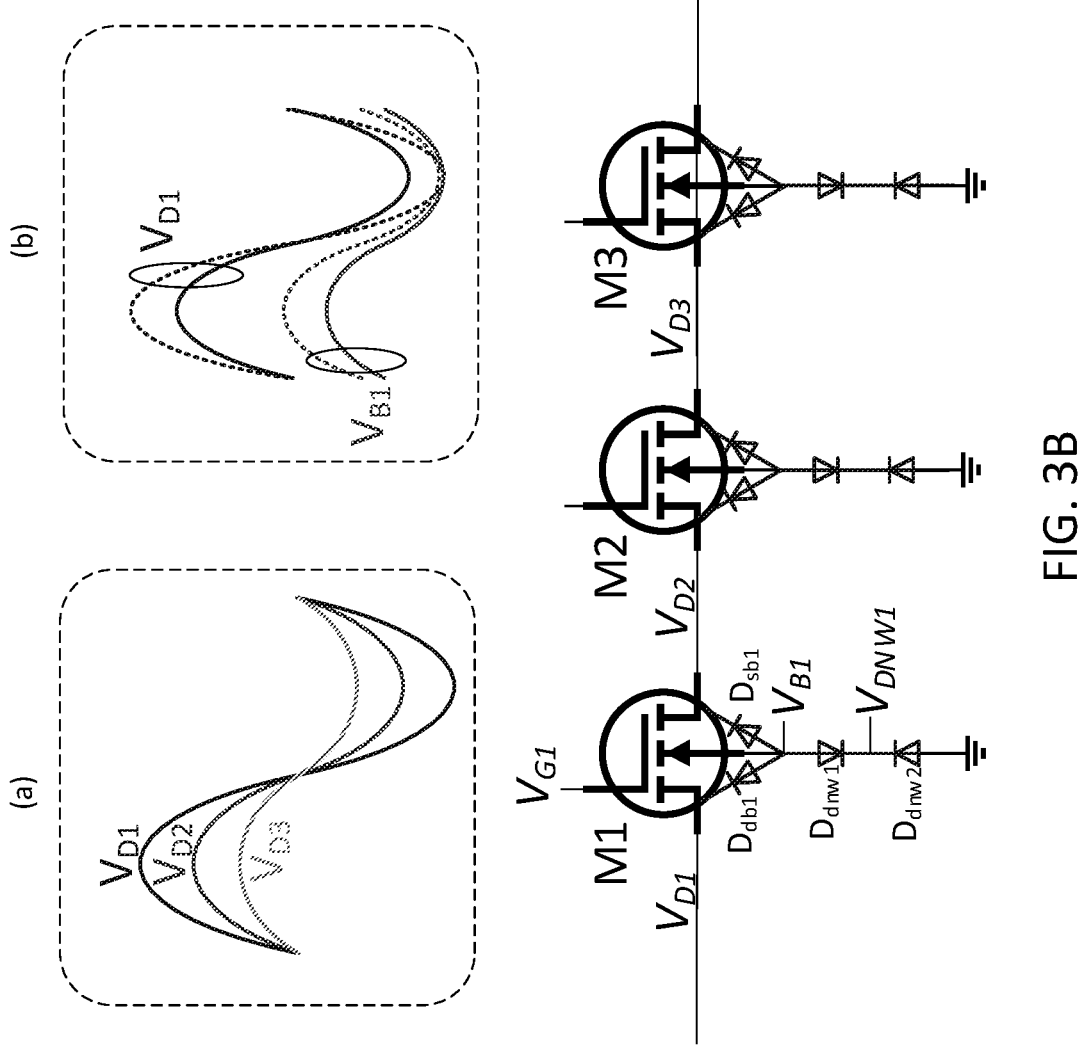
FIG. 3B is a diagram illustrating voltage waveforms at different nodes of the series-shunt switch topology.

FIG. 3B is a diagram illustrating voltage waveforms at different nodes of the series-shunt switch topology. With multiple series switches 318 (switch transistors M1, M2, and M3), the power handling capability may be increased, because the voltage swing at the input may be evenly divided across gate-to-drain and gate-to-source of the stacked switch transistors (M1, M2, and M3), with voltage swings across each transistor within its breakdown limit. However, the turning on of drain-to-bulk or source-to-bulk p-n junction diodes (i.e., $D_{db}$ or $D_{sb}$) under a high power level also limits power handling capabilities. Voltage swings at $V_{D1}$, before transistor M1, at $V_{D2}$, between transistors M1 and M2, and at $V_{D3}$, between transistors M2 and M3, are shown in graph (a). With respect to the off series switches, the first switch transistor M1 is usually the bottleneck, since the voltage swing on the input side is larger than the output side. Therefore $D_{db}$ or $D_{sb}$ of the first switch transistor M1 would be the earliest to turn on under high power conditions.

As illustrated in FIG. 3B, as transmission power increases, the voltage swing at $V_{D1}$ increases, but the voltage at $V_{B1}$ cannot swing low enough to stop the diode from turning on. This is demonstrated in graph (b), in which the solid line represents waveforms for a low transmission power and the dotted line represents waveforms for a high transmission power for each of $V_{D1}$ and $V_{B1}$.

Figure 3C:
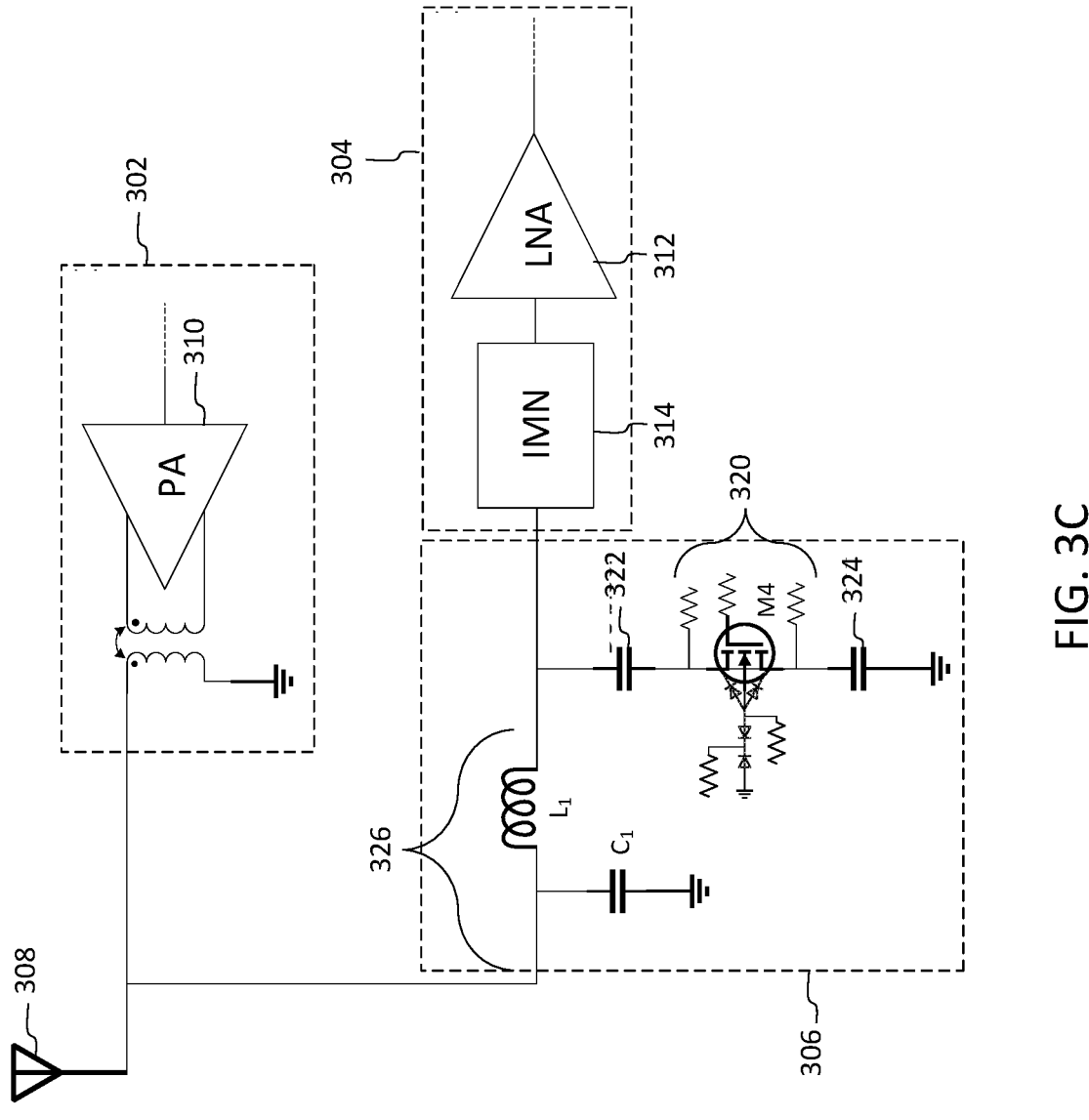
FIG. 3C is a diagram illustrating a T/R interface with an RF shunt-only switch topology in a bulk CMOS process.

FIG. 3C is a diagram illustrating a T/R interface with an RF shunt-only switch topology in a bulk CMOS process. The interface includes the transmission FE circuitry 302, the reception FE circuitry 304, the SPST switch 306, and the antenna 308. The transmission FE circuitry 302 includes the PA 310, and the reception FE circuitry includes the LNA 312 and the IMN 314.

The series switches 318 of FIG. 3A are replaced with impedance transformation circuits 326 formed by an inductor $L_1$ and a capacitor $C_1$. A shunt switch transistor M4 turns off during reception, and turns on during transmission. The inductor $L_1$ and the capacitor $C_1$ are designed as part of the IMN 314. During transmission, the impedance transformation circuits transform the low resistance on the output side (due to shunt switch transistor M4 turning on) to a high value of $R_{off}$ on the input side. Also, since all the switch transistors are turned on, the power handling capabilities may be significantly higher than a series-shunt switch topology. However, a major drawback of this topology is that, in practice, the value of $R_{off}$ is limited by the quality factor of the inductor $L_1$ implemented on lossy silicon substrate in bulk CMOS technology, making this topology much less attractive for optimal transmission output power and power efficiency.

Figure 4A:
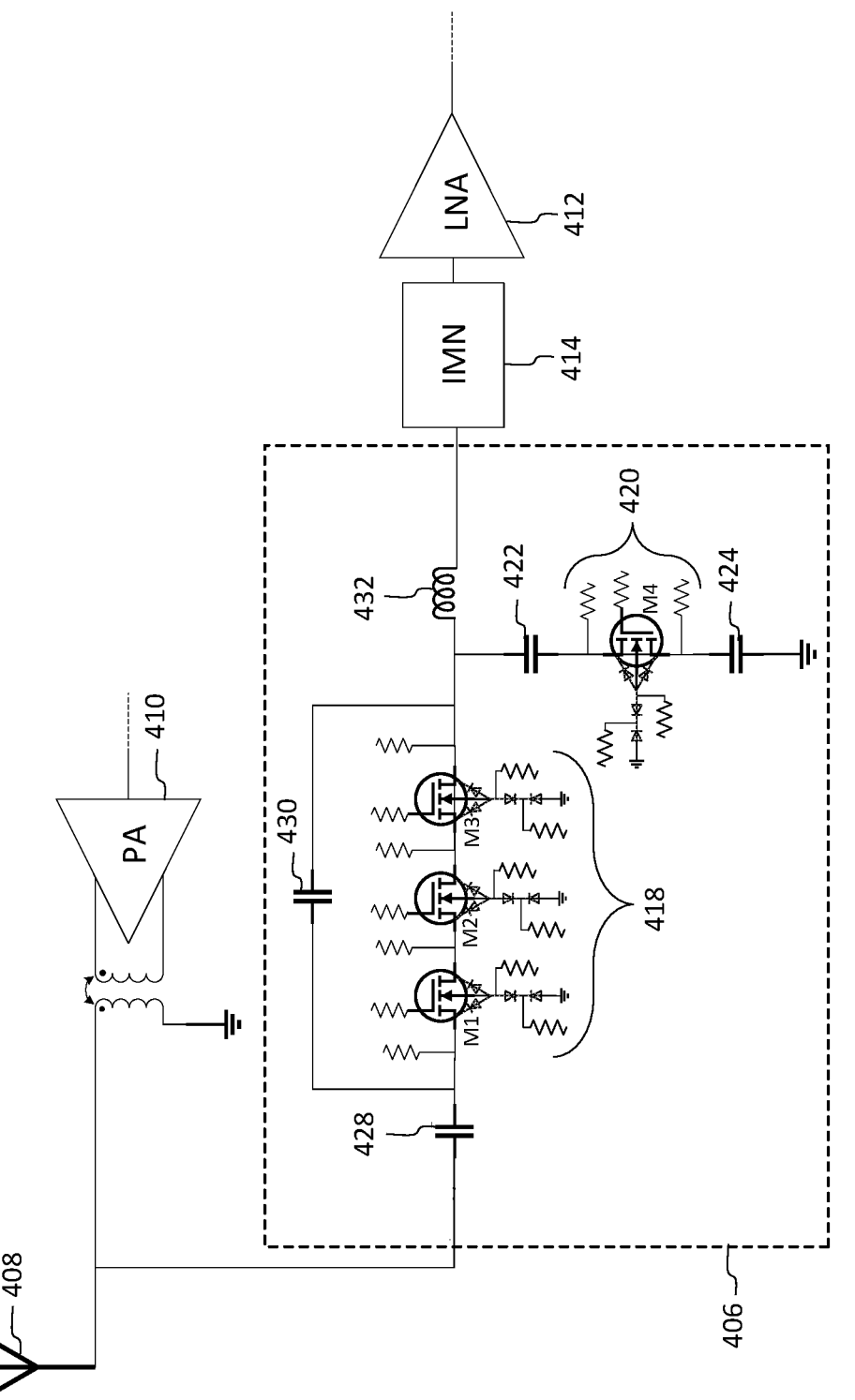
FIG. 4A is a diagram illustrating an RF switch topology used in a T/R interface, according to an embodiment.

FIG. 4A is a diagram illustrating an RF switch topology used in a T/R interface, according to an embodiment. The interface includes a PA 410 in transmission FE circuitry, an LNA 412 and an IMN 414 in reception FE circuitry, an SPST switch 406, and an antenna 408. Similar to FIG. 3A, the SPST switch 406 includes three series switches 418, and one shunt switch 420 between DC block capacitors 422 and 424.

A series capacitor 428 is disposed at an input side of the SPST switch 406. The series capacitor 428 may be embodied as an alternating current (AC) capacitor having non-negligible or relatively large reactance at the operating frequency, which differs from a DC decoupling capacitor with negligible reactance. A parallel capacitor 430 is disposed across the stacked switch transistors (M1, M2, and M3) 418. A series inductor 432 is disposed at an output side of the SPST switch 406, after the branch for the shunt switch 420. The gates, drains, sources, bodies, and deep n-well (DNW) terminals of all the transistors are DC biased with large resistors. While FIG. 4A illustrates switches with DNW transistors, the switches may also be embodied as NMOS transistors without DNW.

Figures 4B, 4C:
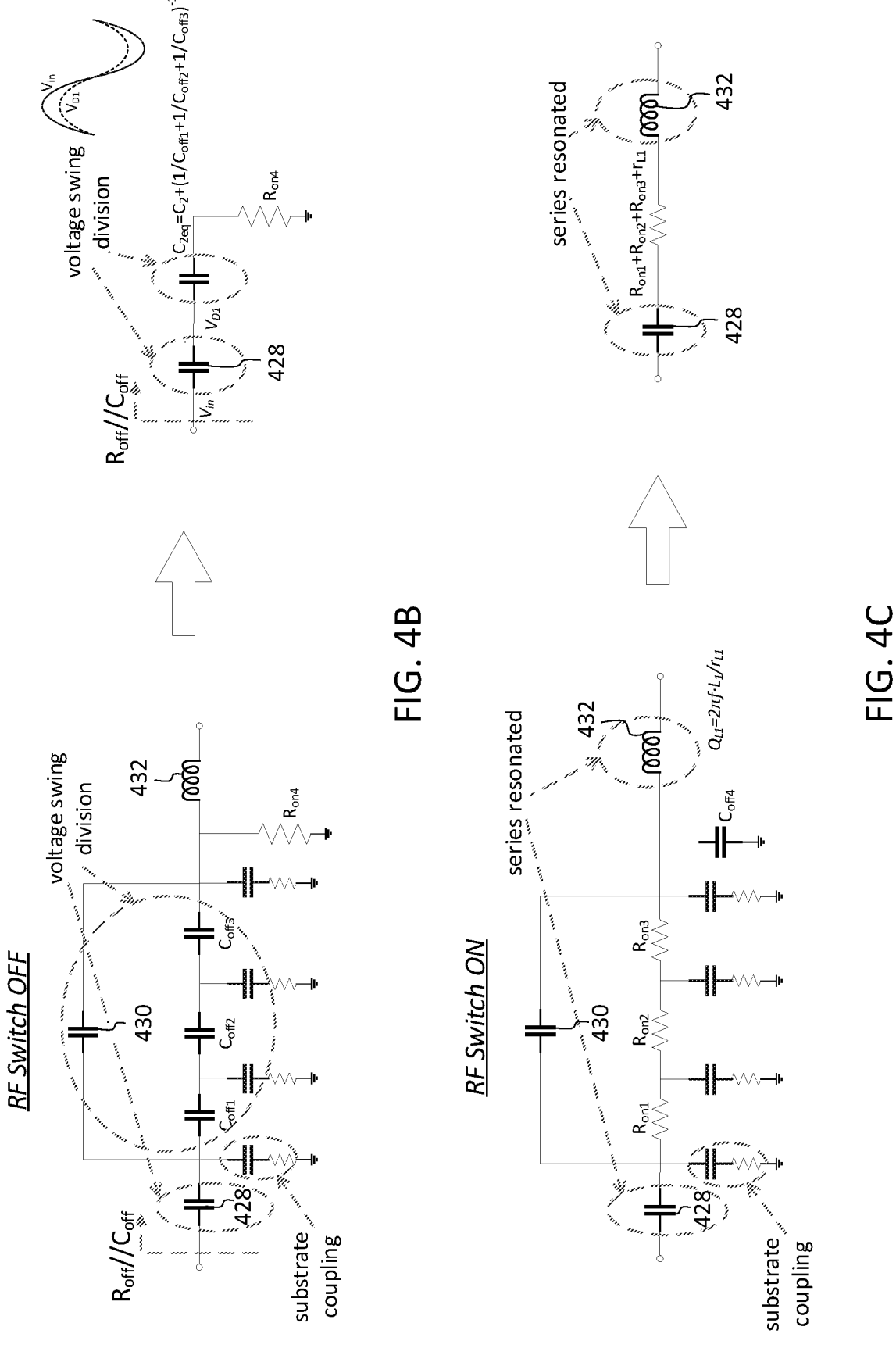
FIG. 4B is a diagram illustrating the RF switch equivalent circuit model when the switch turns off, according to an embodiment.
FIG. 4C is a diagram illustrating a simplified circuit model when the RF switch turns on, according to an embodiment.

FIG. 4B is a diagram illustrating the RF switch equivalent circuit model when the switch turns off, according to an embodiment. As shown in FIG. 4B, $C_1$ and $C_{2eq}$ of the SPST switch 406 form a voltage swing division to obtain a voltage swing of $V_{D1}$, which is smaller than the input voltage swing $V_{in}$, with $V_{D1}$ given by Equation (1) below.

$$V_{D1} = \qquad\qquad\qquad\qquad\qquad\qquad\qquad (1)$$

$$V_{in} \cdot C_1 / (C_1 + C_{2eq}) = V_{in} \cdot C_1 / \left[ C_1 + C_2 + \left( C_{off1}^{-1} + C_{off2}^{-1} + C_{off3}^{-1} \right)^{-1} \right]$$

The voltage swing of $V_{D1}$ at the first series transistor M1 may be reduced by selecting a smaller $C_1$ and/or a larger $C_2$, so that the power handling capability may be extended. The parallel equivalent off resistance $R_{off}$ is given by Equation (2) below.

$$R_{off} \approx R_{on4} \cdot Q_c^2 \qquad\qquad\qquad\qquad (2)$$

$Q_c$ is given by Equation (3) below.

$$Q_c = \left[ 2\pi f \cdot C_1 \cdot C_{2eq}/(C_1 + C_{2eq}) \cdot R_{on4} \right]^{-1} \quad (3)$$

By substituting Equation (3) into Equation (2), $R_{off}$ can be written as Equation (4) below.

$$R_{off} \approx \left[ 2\pi f \cdot C_1 \cdot C_{2eq}/(C_1 + C_{2eq}) \right]^{-2} \cdot R_{on4}^{-1} \quad (4)$$

As described above, a higher $R_{off}$ is obtained with a lower $R_{on4}$ or a higher $Q_c$. Unlike the conventional shunt-only switch topology, $R_{off}$ is not a function of the quality factor of the inductor, which is quite low in bulk CMOS technology.

FIG. 4C is a diagram illustrating a simplified circuit model when the RF switch turns on, according to an embodiment. The inductor 432 and the first capacitor 428 of the SPST 406 form a series resonance at the center frequency of operation. Therefore, at a center frequency, there is only an equivalent series resistor with the resistance of $R_{on1}+R_{on2}+R_{on3}+r_{L1}$ between the input and the output, which determines the insertion loss. $R_{on1}$, $R_{on2}$, $R_{on3}$ are the respective on resistances of M1, M2, M3 transistors, and $r_{L1}$ is the series resistance of the inductor 432.

The switch topology can extend the maximum power handling capability by greater than 1-2 dB while achieving an $R_{off}$ greater than 1 K$\Omega$.

Figure 5:
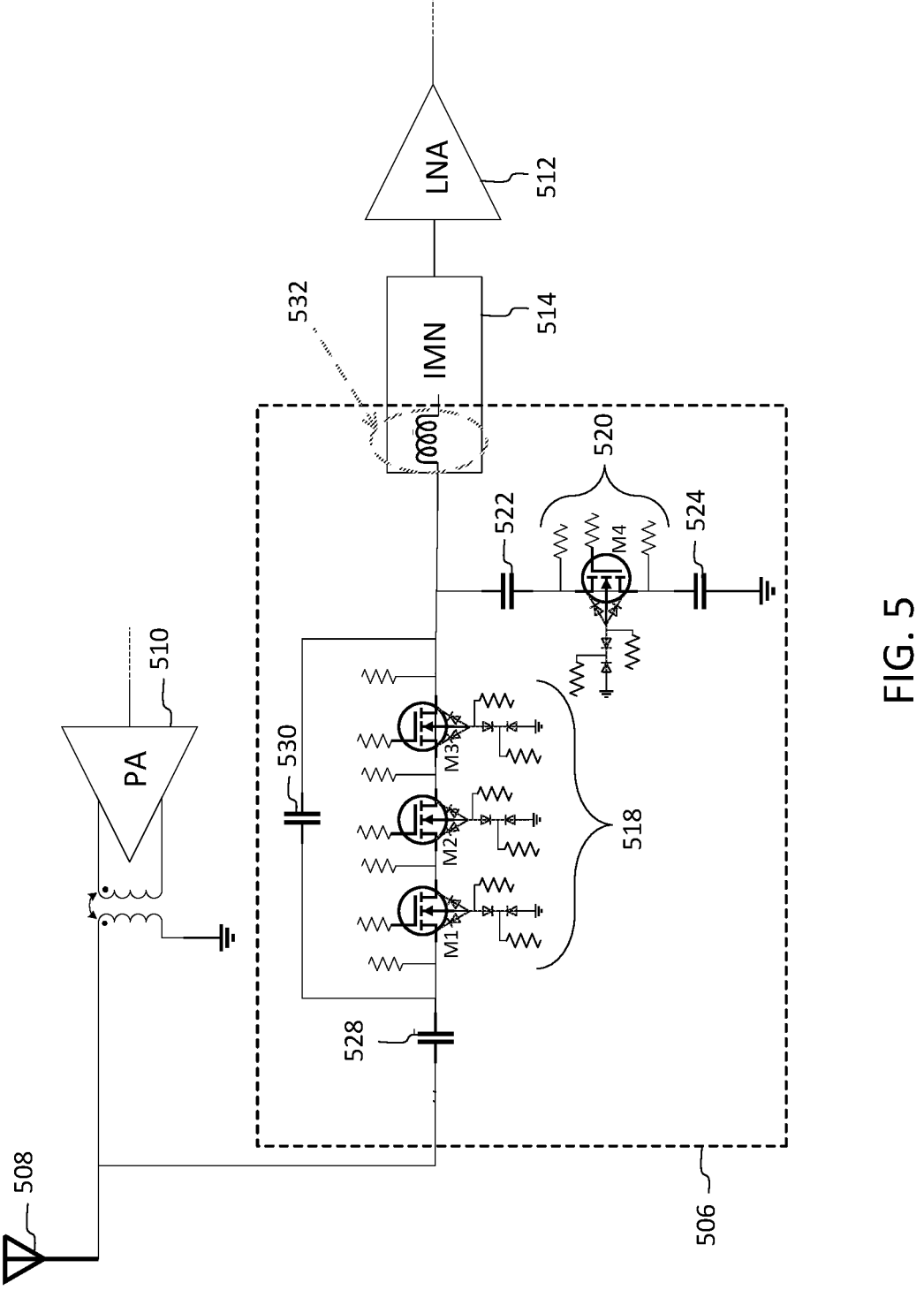
FIG. 5 is a diagram illustrating an RF switch topology, according to another embodiment.

FIG. 5 is a diagram illustrating an RF switch topology, according to another embodiment. The interface includes a PA 510 in the transmission FE circuitry, an LNA 512 and an IMN 514 in the reception FE circuitry, an SPST switch 506, and an antenna 508. Similar to FIG. 4A, the SPST switch 506 includes three series switches 518, and one shunt switch 520 between DC block capacitors 522 and 524. A series capacitor 528 is disposed at an input side of the SPST switch 506. A parallel capacitor 530 is disposed across stacked switch transistors (M1, M2, and M3) 518. A series inductor 532 is disposed at an output side of the SPST switch 506.

The SPST switch 506 is similar to the SPST switch 406 of FIG. 4A, with the exception being that the series inductor 532 is co-designed, integrated, or absorbed into the IMN 514 of the reception FE circuitry. An advantage of such an approach is the compact area and the smaller degradation of insertion loss due to the quality factor of the series inductor 532.

Figure 6A:
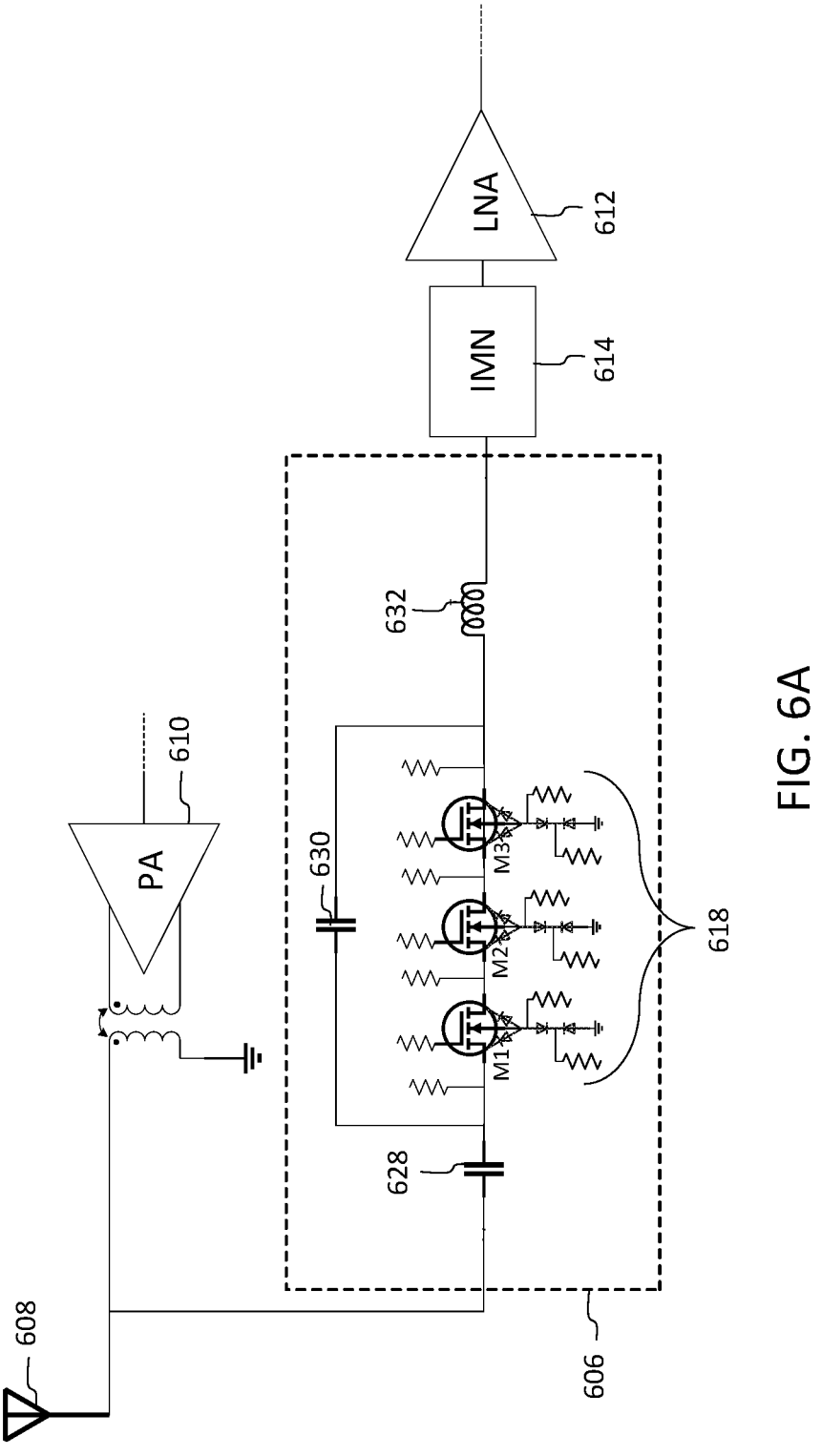
FIG. 6A is a diagram illustrating an RF switch without a shunt switch, according to an embodiment.

FIG. 6A is a diagram illustrating an RF switch without a shunt switch, according to an embodiment. The interface includes a PA 610 in the transmission FE circuitry, an LNA 612 and an IMN 614 in the reception FE circuitry, an SPST switch 606, and an antenna 608. The SPST switch 606 includes three series switches 618. A series capacitor 628 is disposed at an input side of the SPST switch 606. A parallel capacitor 630 is disposed across stacked switch transistors (M1, M2, and M3) 618. A series inductor 632 is disposed at an output side of the SPST switch 606. The SPST switch 606 is similar to the SPST switch 406 of FIG. 4A, with the exception being that it does not include the branch with the shunt switch transistor M4.

Figure 6B:
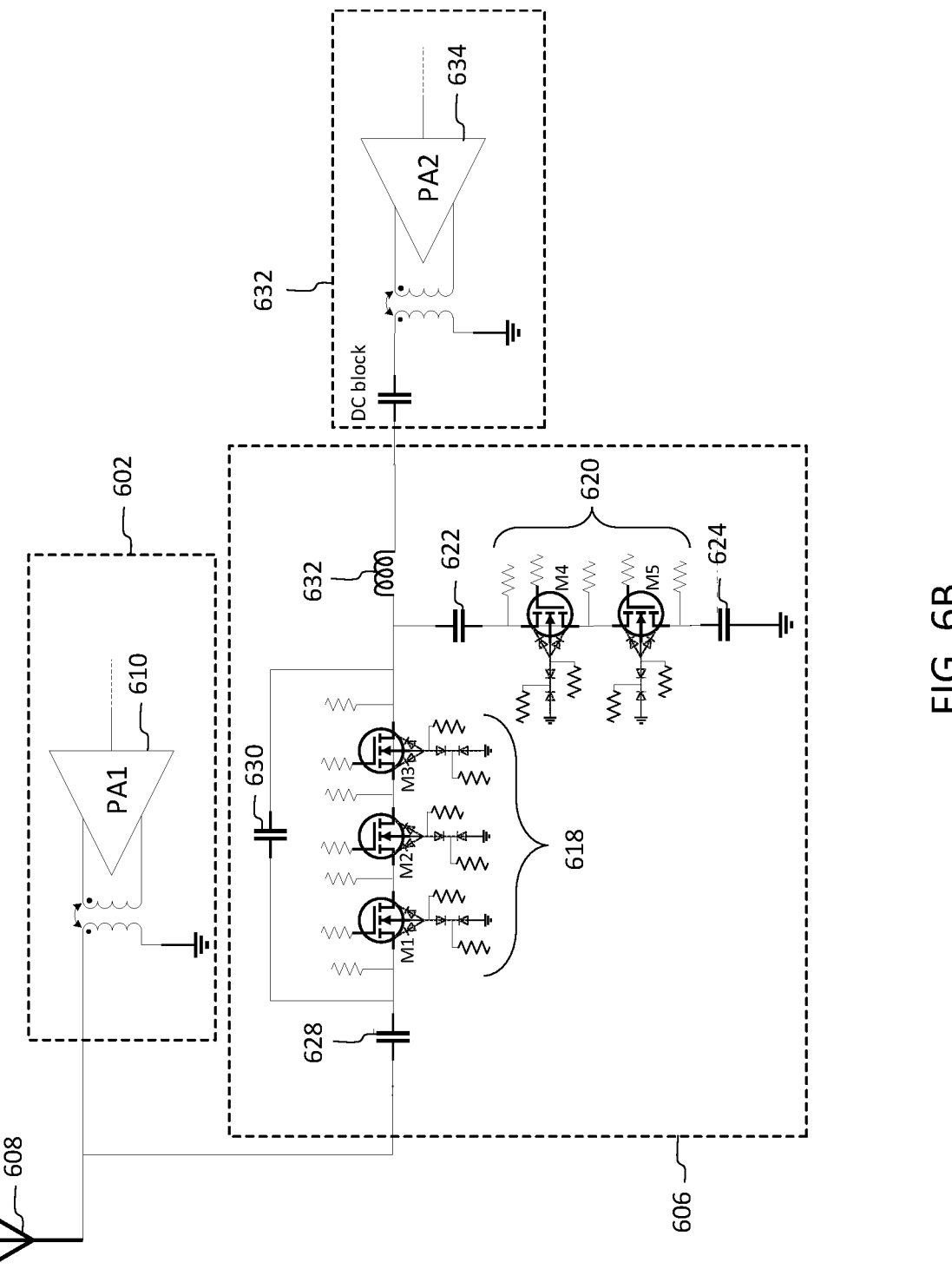
FIG. 6B is a diagram illustrating an RF switch that uses multiple stacks of shunt switches, according to an embodiment.

FIG. 6B is a diagram illustrating an RF switch that uses multiple stacks of shunt switches and is applicable at an interface between two transmitters, according to an embodiment. The interface includes the first transmission FE circuitry 602, second transmission FE circuitry 632, the SPST switch 606, and the antenna 608. The first transmission FE circuitry 602 includes the first PA 610, and the second transmission FE circuitry 632 includes a second PA 634. The SPST switch 606 is similar to the SPST switch 406 of FIG. 4A, with the exception that it includes multiple stacked shunt switch transistors M4 and M5. Specifically, the SPST switch 606 includes the three series switches 618, and two shunt switches 620 between the DC block capacitors 622 and 624. The series capacitor 628 is disposed at the input side of the SPST switch 606. The parallel capacitor 630 is disposed across the stacked switch transistors (M1, M2, and M3) 618. The series inductor 632 is disposed at an output side of the SPST switch 606.

Embodiments of the disclosure include a series capacitor, in place of a DC block capacitor, at the input, a parallel capacitor across stacked series switches, and a series inductor at the output. A shunt switch is connected to the ground between the series inductor and the series stacked switches. The series inductor may be co-designed with or absorbed into the IMN of the RX FE.

Figure 7:
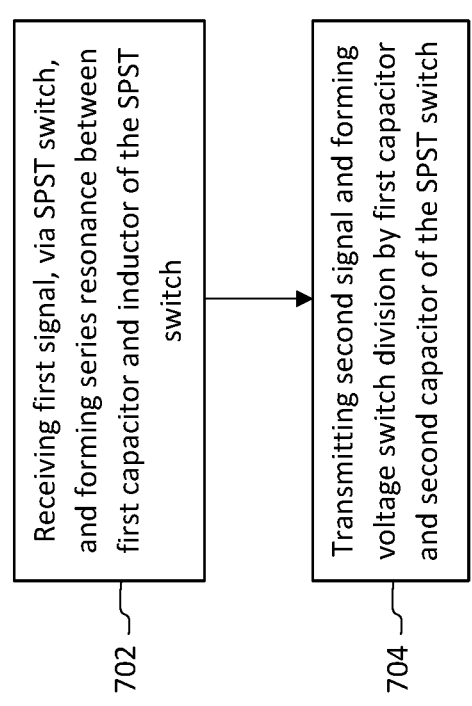
FIG. 7 is a flowchart illustrating method for operating an RF transceiver, according to an embodiment.

FIG. 7 is a flowchart illustrating a method for operating an RF transceiver, according to an embodiment.

At 702, a first signal is received via an SPST switch and reception FE circuitry of the RF transceiver. A series resonance at a center frequency of operation is formed between a first capacitor disposed at an input side of the SPST switch and an inductor disposed at an output side of the SPST switch, reducing an insertion loss caused by the SPST switch.

At 704, a second signal is transmitted via transmission FE circuitry of the RF transceiver. A voltage switch division is formed by the first capacitor of the SPST switch and a second capacitor disposed, in parallel, across one or more switches of the SPST switch, reducing a voltage swing at a first switch of the one or more switches and increasing a parallel equivalent off resistance at the first switch.

Embodiments of the disclosure enhance power handling capabilities of the SPST switch in bulk CMOS technology. A high $R_{off}$ is maintained, which is crucial in transmission to achieve high transmission output power and power efficiency. Through proper selections of the series capacitor, the parallel capacitor, and the series inductor, design optimizations are enabled among high power handling capabilities, a high RaR, and a low insertion loss. By co-designing or absorbing the series inductor into IMN of RX FE, the degradation in the insertion loss due to the limited quality factor of the series inductor may be reduced.

Figure 8:
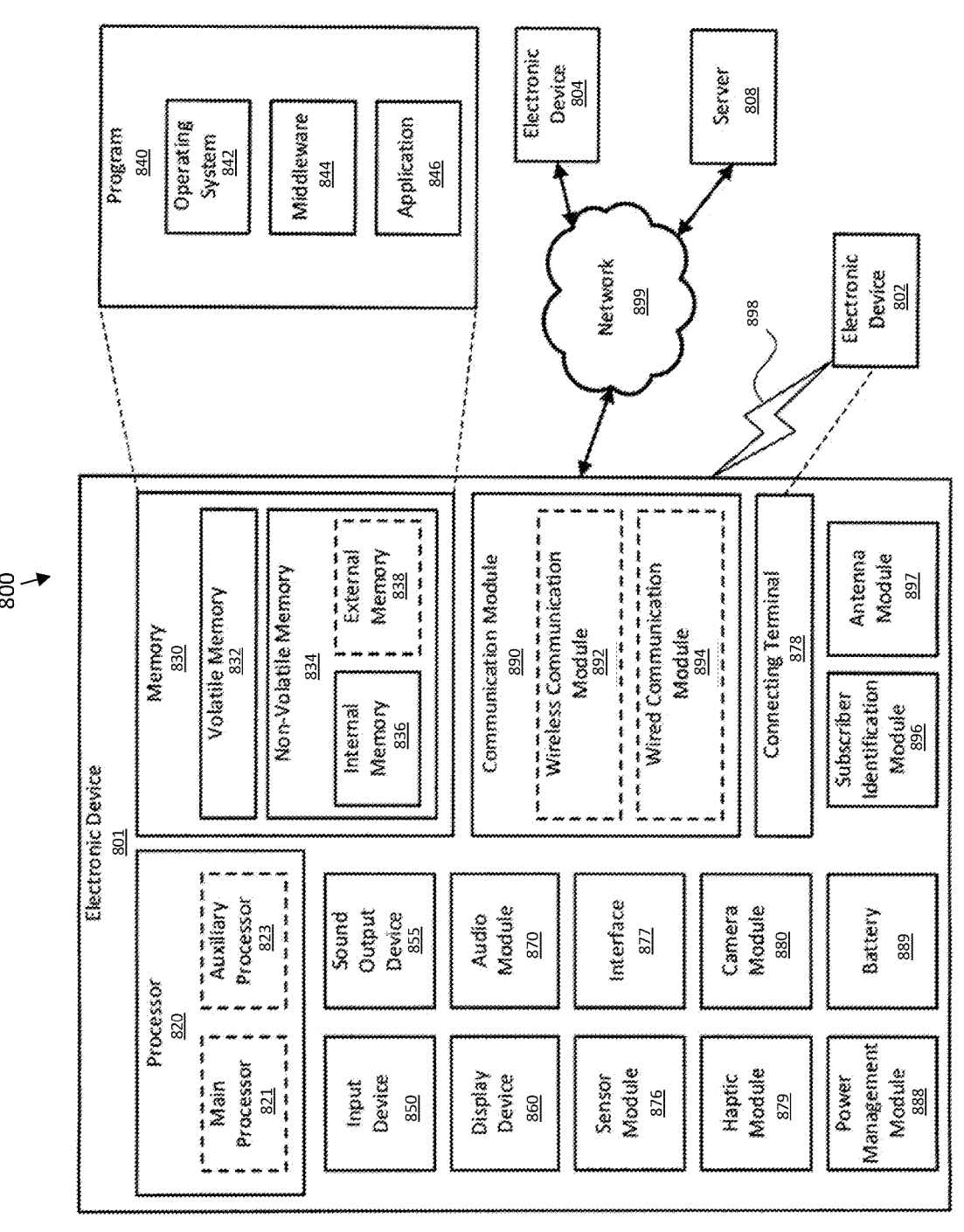
FIG. 8 is a block diagram of an electronic device in a network environment, according to an embodiment.

FIG. 8 is a block diagram of an electronic device in a network environment, according to an embodiment.

Referring to FIG. 8, an electronic device 801 in a network environment 800 may communicate with an electronic device 802 via a first network 898 (e.g., a short-range wireless communication network), or an electronic device 804 or a server 808 via a second network 899 (e.g., a long-range wireless communication network). The electronic device 801 may communicate with the electronic device 804 via the server 808. The electronic device 801 may include a processor 820, a memory 830, an input device 840, a sound output device 855, a display device 860, an audio module 870, a sensor module 876, an interface 877, a haptic module 879, a camera module 880, a power management module 888, a battery 889, a communication module 890, a subscriber identification module (SIM) card 896, or an antenna module 894. In one embodiment, at least one (e.g., the display device 860 or the camera module 880) of the components may be omitted from the electronic device 801, or one or more other components may be added to the electronic device 801. Some of the components may be implemented as a single integrated circuit (IC). For example, the sensor module 876 (e.g., a fingerprint sensor, an iris sensor, or an illuminance sensor) may be embedded in the display device 860 (e.g., a display).

The processor 820 may execute software (e.g., a program 840) to control at least one other component (e.g., a hardware or a software component) of the electronic device 801 coupled with the processor 820 and may perform various data processing or computations.

As at least part of the data processing or computations, the processor 820 may load a command or data received from another component (e.g., the sensor module 846 or the communication module 890) in volatile memory 832, process the command or the data stored in the volatile memory 832, and store resulting data in non-volatile memory 834. The processor 820 may include a main processor 821 (e.g., a central processing unit (CPU) or an application processor (AP)), and an auxiliary processor 823 (e.g., a graphics processing unit (GPU), an image signal processor (ISP), a sensor hub processor, or a communication processor (CP)) that is operable independently from, or in conjunction with, the main processor 821. Additionally or alternatively, the auxiliary processor 823 may be adapted to consume less power than the main processor 821, or execute a particular function. The auxiliary processor 823 may be implemented as being separate from, or a part of, the main processor 821.

The auxiliary processor 823 may control at least some of the functions or states related to at least one component (e.g., the display device 860, the sensor module 876, or the communication module 890) among the components of the electronic device 801, instead of the main processor 821 while the main processor 821 is in an inactive (e.g., sleep) state, or together with the main processor 821 while the main processor 821 is in an active state (e.g., executing an application). The auxiliary processor 823 (e.g., an image signal processor or a communication processor) may be implemented as part of another component (e.g., the camera module 880 or the communication module 890) functionally related to the auxiliary processor 823.

The memory 830 may store various data used by at least one component (e.g., the processor 820 or the sensor module 876) of the electronic device 801. The various data may include, for example, software (e.g., the program 840) and input data or output data for a command related thereto. The memory 830 may include the volatile memory 832 or the non-volatile memory 834.

The program 840 may be stored in the memory 830 as software, and may include, for example, an operating system (OS) 842, middleware 844, or an application 846.

The input device 850 may receive a command or data to be used by another component (e.g., the processor 820) of the electronic device 801, from the outside (e.g., a user) of the electronic device 801. The input device 850 may include, for example, a microphone, a mouse, or a keyboard.

The sound output device 855 may output sound signals to the outside of the electronic device 801. The sound output device 855 may include, for example, a speaker or a receiver. The speaker may be used for general purposes, such as playing multimedia or recording, and the receiver may be used for receiving an incoming call. The receiver may be implemented as being separate from, or a part of, the speaker.

The display device 860 may visually provide information to the outside (e.g., a user) of the electronic device 801. The display device 860 may include, for example, a display, a hologram device, or a projector and control circuitry to control a corresponding one of the display, hologram device, and projector. The display device 860 may include touch circuitry adapted to detect a touch, or sensor circuitry (e.g., a pressure sensor) adapted to measure the intensity of force incurred by the touch.

The audio module 870 may convert a sound into an electrical signal and vice versa. The audio module 870 may obtain the sound via the input device 850 or output the sound via the sound output device 855 or a headphone of an external electronic device 802 directly (e.g., wired) or wirelessly coupled with the electronic device 801.

The sensor module 876 may detect an operational state (e.g., power or temperature) of the electronic device 801 or an environmental state (e.g., a state of a user) external to the electronic device 801, and then generate an electrical signal or data value corresponding to the detected state. The sensor module 876 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 877 may support one or more specified protocols to be used for the electronic device 801 to be coupled with the external electronic device 802 directly (e.g., wired) or wirelessly. The interface 877 may include, for example, a high-definition multimedia interface (HDMI), a universal serial bus (USB) interface, a secure digital (SD) card interface, or an audio interface.

A connecting terminal 878 may include a connector via which the electronic device 801 may be physically connected with the external electronic device 802. The connecting terminal 878 may include, for example, an HDMI connector, a USB connector, an SD card connector, or an audio connector (e.g., a headphone connector).

The haptic module 879 may convert an electrical signal into a mechanical stimulus (e.g., a vibration or a movement) or an electrical stimulus which may be recognized by a user via tactile sensation or kinesthetic sensation. The haptic module 879 may include, for example, a motor, a piezoelectric element, or an electrical stimulator.

The camera module 880 may capture a still image or moving images. The camera module 880 may include one or more lenses, image sensors, image signal processors, or flashes. The power management module 888 may manage power supplied to the electronic device 801. The power management module 888 may be implemented as at least part of, for example, a power management integrated circuit (PMIC).

The battery 889 may supply power to at least one component of the electronic device 801. The battery 889 may include, for example, a primary cell which is not rechargeable, a secondary cell which is rechargeable, or a fuel cell.

The communication module 890 may support establishing a direct (e.g., wired) communication channel or a wireless communication channel between the electronic device 801 and the external electronic device (e.g., the electronic device 802, the electronic device 804, or the server 808) and performing communication via the established communication channel. The communication module 890 may include one or more communication processors that are operable independently from the processor 820 (e.g., the AP) and supports a direct (e.g., wired) communication or a wireless communication. The communication module 890 may include a wireless communication module 892 (e.g., a cellular communication module, a short-range wireless communication module, or a global navigation satellite system (GNSS) communication module) or a wired communication module 894 (e.g., a local area network (LAN) communication module or a power line communication (PLC) module). A corresponding one of these communication modules may communicate with the external electronic device via the first network 898 (e.g., a short-range communication network, such as Bluetooth™, wireless-fidelity (Wi-Fi) direct, or a standard of the Infrared Data Association (IrDA)) or the second network 899 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 892 may identify and authenticate the electronic device 801 in a communication network, such as the first network 898 or the second network 899, using subscriber information (e.g., international mobile subscriber identity (IMSI)) stored in the subscriber identification module 896.

The antenna module 897 may be embodied to include the RF switch described above with respect to FIGS. 4A-6B. The antenna module 897 may transmit or receive a signal or power to or from the outside (e.g., the external electronic device) of the electronic device 801. The antenna module 897 may include one or more antennas, and, therefrom, at least one antenna appropriate for a communication scheme used in the communication network, such as the first network 898 or the second network 899, may be selected, for example, by the communication module 890 (e.g., the wireless communication module 892). The signal or the power may then be transmitted or received between the communication module 890 and the external electronic device via the selected at least one antenna.

Commands or data may be transmitted or received between the electronic device 801 and the external electronic device 804 via the server 808 coupled with the second network 899. Each of the electronic devices 802 and 804 may be a device of a same type as, or a different type, from the electronic device 801. All or some of operations to be executed at the electronic device 801 may be executed at one or more of the external electronic devices 802, 804, or 808. For example, if the electronic device 801 should perform a function or a service automatically, or in response to a request from a user or another device, the electronic device 801, instead of, or in addition to, executing the function or the service, may request the one or more external electronic devices to perform at least part of the function or the service. The one or more external electronic devices receiving the request may perform the at least part of the function or the service requested, or an additional function or an additional service related to the request and transfer an outcome of the performing to the electronic device 801. The electronic device 801 may provide the outcome, with or without further processing of the outcome, as at least part of a reply to the request. To that end, a cloud computing, distributed computing, or client-server computing technology may be used, for example.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-stor-age medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A single-pole single-throw (SPST) radio frequency (RF) switch comprising:

one or more switches stacked in series;

a first capacitor disposed at an input side of the SPST RF switch, in series, before the one or more switches;

a second capacitor disposed, in parallel, across the one or more switches, wherein the first capacitor and the second capacitor are connected at a shared node;

an inductor disposed at an output side of the SPST RF switch, in series, after the one or more switches;

one or more shunt switches disposed in a branch between an output side of the one or more switches and an input side of the inductor; and a third capacitor in the branch on an input side of the one or more shunt switches, and a fourth capacitor in the branch on an output side of the one or more shunt switches.

2. The SPST RF switch of claim 1, wherein each of the one or more switches comprises a deep n-well transistor.

3. The SPST RF switch of claim 1, wherein the one or more switches are in a switch-on state in an on state of the SPST RF switch, and the one or more switches are in a switch-off state in an off state of the SPST RF switch.

4. The SPST RF switch of claim 3, wherein, in case that the SPST RF switch is in the off state, the first capacitor and the second capacitor are configured to form a voltage switch division that results in a reduction in voltage swing at a first switch of the one or more switches.

5. The SPST RF switch of claim 3, wherein, in case that the SPST RF switch is in the on state, the first capacitor and the inductor are configured to form a series resonance at a center frequency of operation having an equivalent series resistor therebetween resulting in improved input and output impedance matching of the SPST RF switch.

6. The SPST RF switch of claim 3, wherein the one or more shunt switches are in a switch-off state in the on state of the SPST RF switch, and the one or more shunt switches are in a switch-on state in the off state of the SPST RF switch.

7. The SPST RF switch of claim 6, wherein the one or more shunt switches comprise a plurality of shunt switches stacked in series in the branch between the one or more switches and the inductor.

8. The SPST RF switch of claim 6, wherein each of the one or more shunt switches comprises a deep n-well transistor.

9. The SPST RF switch of claim 1, wherein the inductor is integrated in an input matching network (IMN) of reception front-end (FE) circuitry.

10. The SPST RF switch of claim 1, wherein the third capacitor, the inductor, the second capacitor and one of the series switches are directly connected to each other.

11. A radio frequency (RF) transceiver comprising:

an antenna;

transmission front-end (FE) circuitry in a transmission branch extending from the antenna;

reception FE circuitry in a reception branch extending from the antenna;

a single-pole single-throw (SPST) switch disposed between the reception FE circuitry and the antenna in the reception branch, wherein the SPST switch comprises:

one or more switches stacked in series;

a first capacitor disposed at an input side of the SPST switch, in series, before the one or more switches;

a second capacitor disposed, in parallel, across the one or more switches, wherein the first capacitor and the second capacitor are connected at a shared node;

an inductor disposed at an output side of the SPST switch, in series, after the one or more switches;

a shunt switch disposed in a branch between an output side of the one or more switches and an input side of the inductor; and a third capacitor in the branch on an input side of the shunt switch, and a fourth capacitor in the branch on an output side of the shunt switch.

12. The RF transceiver of claim 11, wherein each of the one or more switches comprises a deep n-well transistor.

13. The RF transceiver of claim 11, wherein the one or more switches are in a switch-on state in a reception state of the RF transceiver, and the one or more switches are in a switch-off state in a transmission state of the RF transceiver.

14. The RF transceiver of claim 13, wherein, in case that the RF transceiver is in the transmission state, the first capacitor and the second capacitor are configured to form a voltage switch division that results in a reduction in voltage swing at a first switch of the one or more switches and an increase in parallel equivalent off resistance at the first switch.

15. The RF transceiver switch of claim 13, wherein, in case that the RF transceiver is in the reception state, the first capacitor and the inductor are configured to form a series resonance at a center frequency of operation having an equivalent series resistor therebetween resulting in improved input and output impedance matching of the SPST RF switch.

16. The RF transceiver of claim 13, wherein the shunt switch is in a switch-off state in the reception state of the RF transceiver, and the shunt switch is in a switch-on state in the transmission state of the RF transceiver.

17. The RF transceiver of claim 16, wherein the shunt switch comprises a deep n-well transistor.

18. The RF transceiver of claim 11, further comprising an input matching network in the receiving branch, wherein the inductor is integrated in the IMN.

19. A method for operating a radio frequency (RF) transceiver, the method comprising:

receiving a first signal, via a single-pole single-throw (SPST) switch and reception front-end (FE) circuitry of the RF transceiver, wherein a series resonance at a center frequency of operation is formed, between a first capacitor disposed at an input side of the SPST switch and an inductor disposed at an output side of the SPST switch; and transmitting a second signal, via transmission FE circuitry of the RF transceiver, wherein a voltage switch division is formed by the first capacitor of the SPST switch and a second capacitor disposed, in parallel, across one or more switches of the SPST switch, wherein the first capacitor and the second capacitor are connected at a shared node, wherein a shunt switch is disposed in a branch between an output side of the one or more switches of the SPST switch and an input side of an inductor, and wherein the shunt switch is disposed between a third capacitor and fourth capacitor on the branch.

* * * * *